United States Patent [19]
Hwang et al.

[11] Patent Number: 5,267,203
[45] Date of Patent: Nov. 30, 1993

[54] SENSE AMPLIFIER CONTROL CIRCUIT OF A SEMICONDUCTOR MEMORY DEVICE

[75] Inventors: Hong-Seon Hwang, Suwon; Jong-Hyun Choi, Seoul, both of Rep. of Korea

[73] Assignee: SamSung Electronics Co., Ltd., Suwon, Rep. of Korea

[21] Appl. No.: 792,588

[22] Filed: Nov. 15, 1991

[30] Foreign Application Priority Data

Jul. 31, 1991 [KR] Rep. of Korea ............... 1991-13279

[51] Int. Cl.⁵ .............................................. G11C 7/00
[52] U.S. Cl. .................................. 365/190; 365/189.07; 365/189.09; 365/227; 365/230.06
[58] Field of Search .............. 365/190, 189.06, 189.07, 365/189.09, 189.11, 226, 227, 228, 230.06

[56] References Cited

U.S. PATENT DOCUMENTS

| | | | |
|---|---|---|---|
| 4,104,734 | 8/1978 | Herndon | 365/228 |
| 4,585,955 | 4/1986 | Uchida | 365/226 |
| 4,903,237 | 2/1990 | Rao | 365/226 |
| 4,916,665 | 4/1990 | Atsumi et al. | 365/189.09 |
| 5,175,451 | 12/1992 | Imara | 365/189.11 |

*Primary Examiner*—Eugene R. LaRoche
*Assistant Examiner*—Tan Nguyen
*Attorney, Agent, or Firm*—Robert E. Bushnell

[57] ABSTRACT

A sense amplifier control circuit for controlling the voltage applied to a sense amplifier and a memory cell by setting the voltage as a given level (in this case, 4 V) is provided. The sense amplifier control circuit being inputted by the voltage applied to the sense amplifier and the memory cell thereto and generating the output voltage to the gate of the sense amplifier driver includes a comparator for operating whenever the voltage applied to the sense amplifier and memory cell is varied, a level shift circuit for converting an internal power voltage into an external power voltage, a trigger circuit, a driver control circuit and a bias circuit for constantly maintaining the current flowing into the driving element of the driver control circuit. Therefore, the voltage applied to the sense amplifier and memory cell come to have an appropriate rising slope, and after reached to the given level, the control circuit controls the level to be continuously maintained. Consequently, the wrong operation of a chip and the power noise is reduced, to thus improve the reliability of a semiconductor memory device.

32 Claims, 9 Drawing Sheets

SENSE AMPLIFIER CONTROL CIRCUIT OF A SEMICONDUCTOR MEMORY DEVICE

BACKGROUND OF THE INVENTION

The present invention relates to a dynamic random access memory (DRAM), and more particularly to a sense amplifier control circuit which stabilizes the device characteristic of a cell by clamping an external power voltage as an internal power voltage.

With the highly integrated semiconductor memory device, the occupying area of a transistor is reduced, to thereby miniaturize the size of the transistor. Accordingly if an external power voltage is applied to a reduced sense amplifier and a memory cell without any conversion, the device characteristic of the memory cell is distorted. For example, a peak current is increased and power noise is generated during a sensing operation. This results in a malfunctioning of the stable sense amplifier and the memory cell as a memory device. Moreover, in a sense amplifier control circuit, since the external power voltage is applied to the sense amplifier and the memory cell by an active restore signal, through a sense amplifier driver transistor without any conversion, the characteristic of the sense amplifier control circuit, as the memory device, is deteriorated.

FIG. 1 shows a circuit diagram illustrating a conventional sense amplifier control circuit; FIG. 2 shows an operating timing chart of FIG. 1 and FIG. 3 shows a characteristic graph of the voltage applied to a cell in FIG. 1; Referring to FIG. 1, when a p-type sense amplifier enable clock $\phi_{SP}$ is raised to a logic "high" of a power voltage level, a p-type sense amplifier driver enable clock $\phi_{PSE}$ is lowered to a logic "low" of a ground voltage level through an inverter 3, thereby enabling a p-type sense amplifier driver 4 is turned on.

In FIG. 2, when a row address strobe signal $\overline{RAS}$ is set to the logic "low" level, a n-type sense amplifier driver enable clock $\phi_{NSE}$ is set to the logic "high" level, to thereby perform the sensing operation in a n-type sense amplifier. Moreover, the p-type sense amplifier enable clock $\phi_{SP}$ is set to the logic "high" level, as a result, the sensing operation is performed in a p-type sense amplifier. However, as shown in FIG. 3, since the p-type sense amplifier driver 4 transmits most of the external power voltage $ext.V_{CC}$ to the p-type sense amplifier and the memory cell, in case that the external power voltage $ext.V_{CC}$ is set to a sufficiently high level, i.e., the power voltage level, a threshold voltage of the cell is varied, thereby deteriorating the device characteristic of the cell. That is, the life time of the cell becomes shorter, and the peak current is increased and the power noise is generated during the sensing operation. The characteristic of the sense amplifier control circuit, as the memory device, also becomes considerably unstable.

FIG. 4 shows a circuit diagram illustrating another sense amplifier control circuit of a prior art; and FIG. 5 shows an operating timing chart of FIG. 4. The circuit in FIG. 4 is constructed in that a voltage up to a given level, by using an internal power voltage stage, is applied to a sense amplifier and a memory cell. The construction of the internal power voltage stage and its connection in relation to FIG. 4 are described in detail in IEEE Journal of Solid-State Circuits, Vol.24, No.5, "A 45-ns 16-M bit DRAM with Triple-Well Structure", issued on October 1989. In FIG. 4, when the external power voltage $ext.V_{CC}$ is 5 V, an internal power voltage $int.V_{CC}$ of approximately 4 V is selected to clamp the voltage applied to the memory cell and the sense amplifier. If a row address strobe signal $\overline{RAS}$ is lowered to the logic "low" level, NMOS transistors 17 and 18 are turned on, and then, by an output of a comparator in the logic "low" level, a node B is set to the logic "low" level and a node C is set to the logic "high" level. According to the node C of the logic "high" level, a NMOS transistor 20 connected to a constant-current source 30 is turned on, a PMOS transistor 19 is turned off, and NMOS transistors 21, 26 and 27 connected, through respective to a ground voltage are turned on. Moreover, an output node D connected to the drain of the PMOS transistor 19 is set to the logic "low" level and a p-type sense amplifier driver 29 is turned on, thereby raising the voltage of a p-type sense amplifier enable signal SAP. When the voltage of the p-type sense amplifier enable signal SAP reaches up to 4 V, the gate voltage of a NMOS transistor 25 of the comparator is increased, and the gate voltage of each PMOS transistors 22 and 23 is decreased. As a result, the comparator produces the logic "high" level. In response to the logic "high" level of the comparator, node B is set to a logic "high" level; and node C is set to a logic "low" level. The PMOS transistor 19 is then turned on, the NMOS transistor 20 is turned off, and the NMOS transistors 21, 26 and 27 are turned off. The output node D connected to the drain of the PMOS transistor 19 is set to the logic "high" level; and the p-type sense amplifier driver 29 is turned off, thereby maintaining the voltage of the p-type sense amplifier enable signal SAP as a voltage of 4 V. At this time, under the condition that the p-type sense amplifier driver 29 is turned off, the voltage of the p-type sense amplifier enable signal SAP is lowered as much as Δ V, because of the leakage current of each transistor constituting the memory cell and the sense amplifier, as shown in FIG. 5. However, since node C is set at the logic "low" level state, the NMOS transistors 21, 26 and 27 are turned off; and the comparator is thereby incapable of operating. Therefore, the p-type sense amplifier enable signal SAP can't be restored as a normal voltage of 4 V. As a result, a sufficient voltage to the cell and to the sense amplifier is not obtainable, which leads to an insufficient sensing operation of the sense amplifier.

SUMMARY OF THE INVENTION

It is therefore an object of the present invention to provide a sense amplifier control circuit capable of improving the device characteristic of a memory cell, and sufficiently performing the sensing operation of the sense amplifier by maintaining a voltage applied to a memory cell and a sense amplifier at a given level.

In accordance with the present invention, the sense amplifier, comprises a driver control circuit, a bias circuit, and a driving circuit for driving the drive control circuit and the bias circuit. The drive control circuit is connected, by its output line, to a control terminal of a first sense amplifier driver, and is for maintaining the current flowing into the first sense amplifier driver at a given level. The bias circuit connected by its output line to the driver control circuit, is for maintaining the current flowing into a driving device of the driver control circuit at a given level. The driving means receives the output of the sense amplifier of a memory cell array, and transfers the output thereof to the driver control circuit and to the bias circuit, to thereby drive the driver control circuit and the bias circuit. The driving circuit includes a comparator for comparing the voltage applied to a memory cell with a given reference voltage and for producing an output thereof in response to the control of a given clock signal; a level shift circuit for converting the voltage of a second power voltage stage into the voltage of a first power voltage stage by the control of the given clock signal, a comparator enable circuit for enabling or disabling the output of the comparator by the control of the level shift circuit, and a trigger circuit for inverting the output of the comparator.

BRIEF DESCRIPTION OF THE DRAWINGS

The advantages and features of the present invention will become more apparent by describing in detail the preferred embodiment of the present invention with the reference to the attached drawings, in which.

DETAILED DESCRIPTION OF PREFERRED EMBODIMENT

Figure 6:
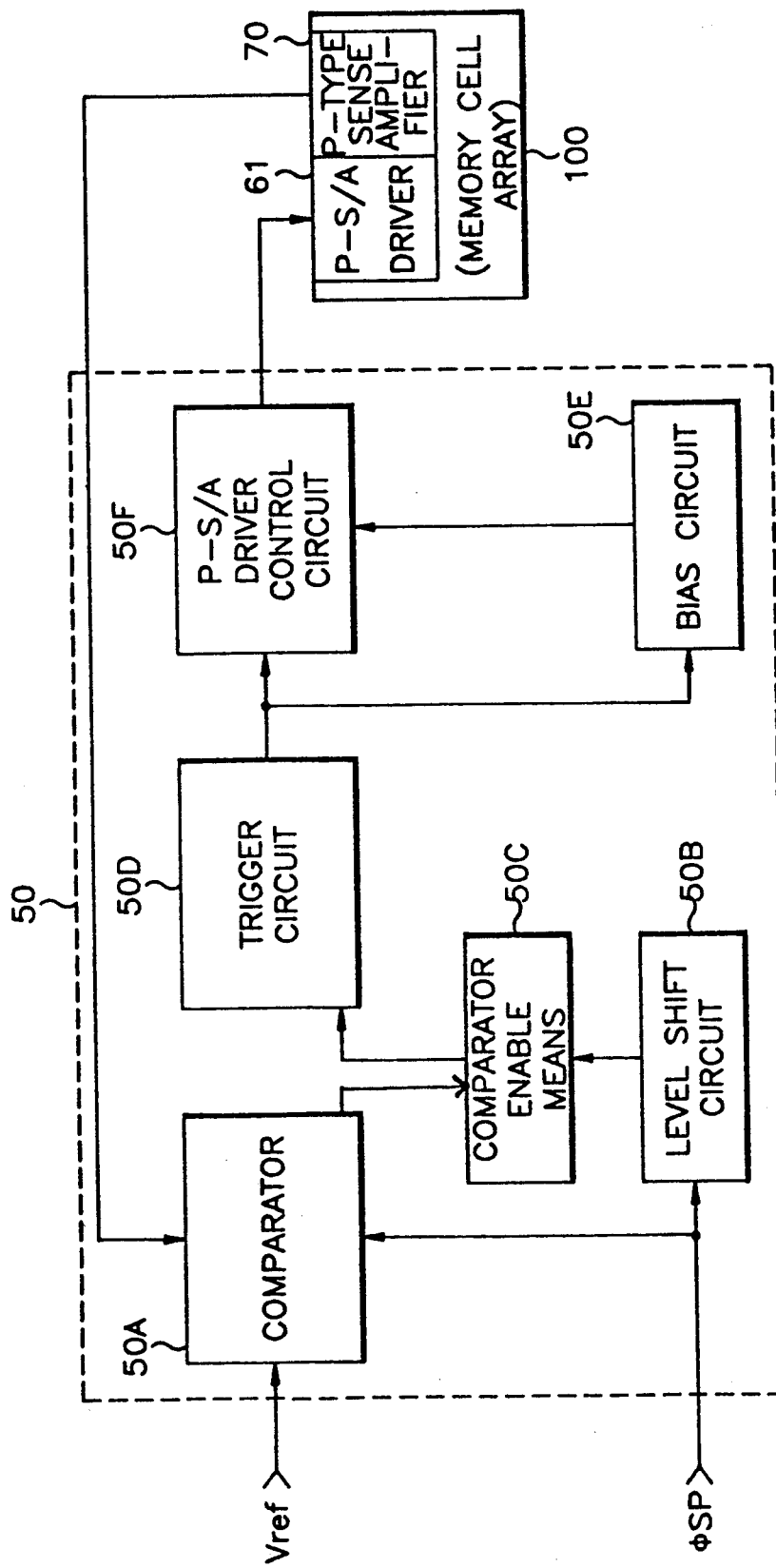
FIG. 6 shows a block diagram of a sense amplifier control circuit according to the present invention.

Referring to FIG. 6, a sense amplifier control circuit 50 includes a comparator 50A, a trigger circuit 50D, a level shift circuit 50B, a comparator enable circuit 50C, a bias circuit 50E and a p-type sense amplifier driver control circuit 50F. The comparator 50A compares the voltage of a p-type sense amplifier 70 of a memory cell array 100 with a given reference voltage $V_{REF}$ in dependence upon a p-type sense amplifier enable signal $\phi_{SP}$ to produce an output thereof. The level shift circuit 50B converts a second power voltage of the p-type sense amplifier enable signal $\phi_{SP}$ into a first power voltage. In this case, the first power voltage is an external power voltage stage having a usual voltage of 5 V and the second power voltage is an internal power voltage stage having a voltage of approximately 4 V. The comparator enable circuit 50C enables or disables the output of the comparator 50A in dependence upon the output of the level shift circuit 50B. The trigger circuit 50D receives the outputs of the comparator 50A and the comparator enable circuit 50C, to produce an inverted output. The bias circuit 50E receives the output of the trigger circuit 50D and controls a constant current flowing into a driving device of the p-type sense amplifier driver control circuit 50F. The p-type sense amplifier driver control circuit 50F receives the outputs of the trigger circuit 50D and the bias circuit 50E, and transfers an output thereof to a p-type sense amplifier driver 61, thereby controlling the constant current flowing into a p-type sense amplifier driver 61.

Figure 7:
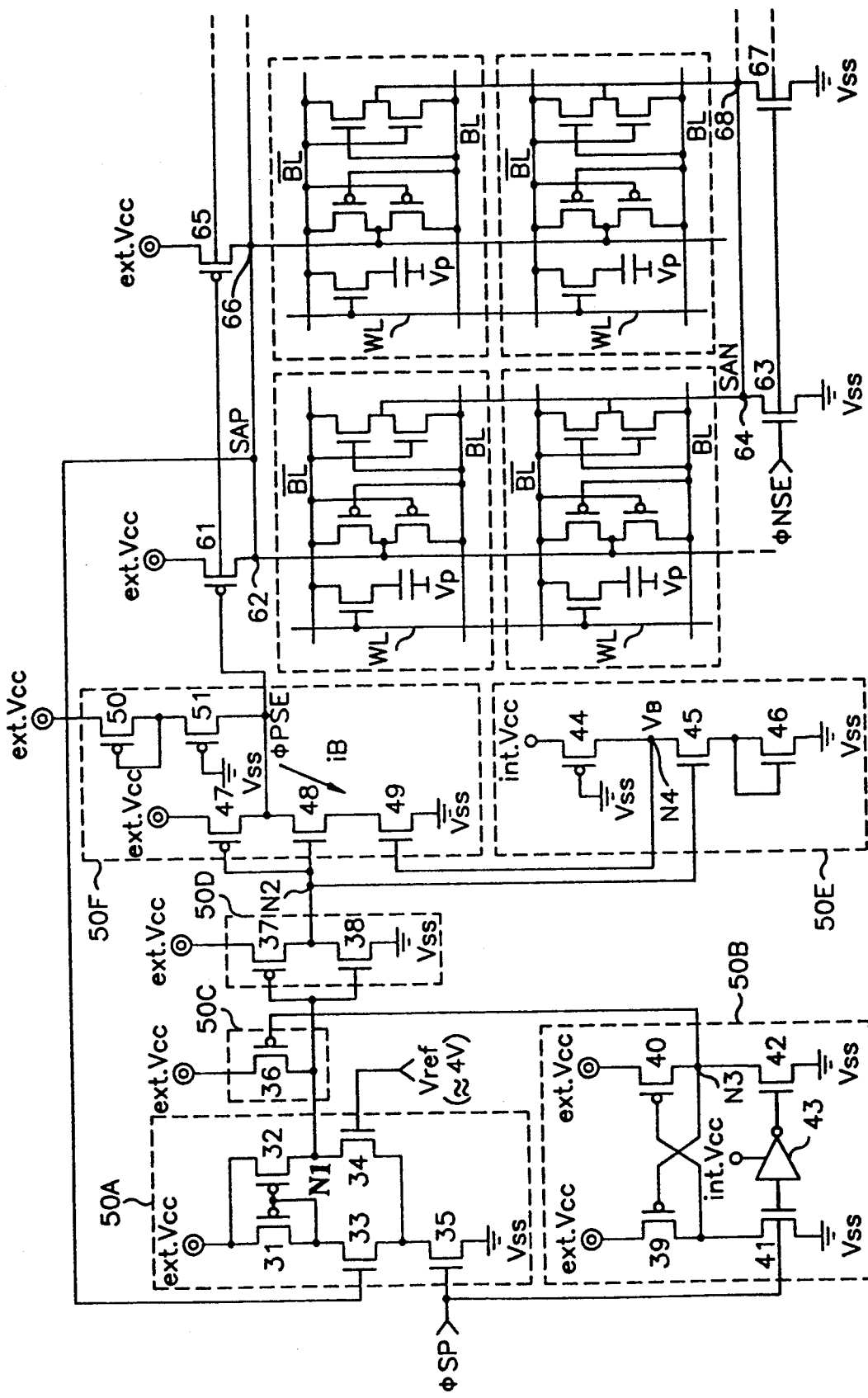
FIG. 7 shows a circuit diagram of a sense amplifier control circuit according to the present invention.

Referring to FIG. 7, the comparator 50A is comprised of a first PMOS transistor 31 having a source connected to an external power voltage $ext.V_{CC}$ and diode-connected gate and drain; a second PMOS transistor 32 having a source connected to the external power voltage $ext.V_{CC}$ and a gate connected to the gate of the first PMOS transistor 31; a first NMOS transistor 33 having a gate connected to a p-type sense amplifier enable node 62 and a drain connected to the drain of the first PMOS transistor 31; a second NMOS transistor 34 having a gate connected to a given reference voltage $V_{REF}$ and a drain connected to the drain of the second PMOS transistor 32; an output node N1 connected to the common terminal of the second PMOS and NMOS transistors 32 and 34; and a third NMOS transistor 35 having a drain connected to the sources of the first and second NMOS transistors 33 and 34, a gate coupled to receive the p-type sense amplifier enable signal $\phi_{SP}$ and a source coupled to receive a ground voltage.

The level shift circuit 50B includes a first PMOS transistor 39 having a source connected to the external power voltage $ext.V_{CC}$; a second PMOS transistor 40 having a source connected to the external power voltage $ext.V_{CC}$; a first NMOS transistor 41 having a gate connected to receive the p-type sense amplifier enable signal $\phi_{SP}$, a source connected to the ground voltage and a drain commonly connected to the drain of the first PMOS transistor 39 and to the gate of the second PMOS transistor 40; an inverter 43 having an input terminal connected to a given clock signal and controlled by an internal power voltage $int.V_{CC}$; a second NMOS transistor 42 having a source connected to the ground voltage and a gate connected to the output terminal of the inverter 43; and an output node N3 commonly connected to the gate of the first PMOS transistor 39 and to each drain of the second PMOS and NMOS transistors 40 and 42.

The comparator enable circuit 50C is comprised of a PMOS transistor 36 having a source connected to the external power voltage $ext.V_{CC}$, a gate connected to the output node of the level shift circuit 50B and a drain connected to the output node of the comparator 50A.

The trigger circuit 50D includes a PMOS transistor 37 having a source connected to the external power voltage $ext.V_{CC}$ and a gate connected to the output node of the comparator 50A; a NMOS transistor 38 having a source connected to the ground voltage and a gate connected to the output node of the comparator 50A; and an output node N2 commonly connected to each drain of the PMOS and NMOS transistors 37 and 38.

The bias circuit 50E is comprised of a PMOS transistor 44 having a source connected to the internal power voltage $int.V_{CC}$ and a gate connected to the ground voltage; a first NMOS transistor 45 having a drain connected to the drain of the PMOS transistor 44 and a gate connected to the output node of the trigger circuit 50D; an output node N4 commonly connected to each drain of the PMOS and first NMOS transistors 44 and 45, for generating a bias voltage $V_B$; and a second NMOS transistor 46 having a drain and gate diode-connected to the source of the first NMOS transistor 45 and having a source connected to the ground voltage.

The p-type sense amplifier driver control circuit 50F includes a PMOS transistor 47 having a source connected to the external power voltage ext.$V_{CC}$ and a gate connected to the output node of the trigger circuit 50D; a first NMOS transistor 48 having a gate connected to the output node of the trigger circuit 50D; an output line commonly connected to the common terminal of the first PMOS and the first NMOS transistors 47 and 48 and the control terminal of the sense amplifier driver 61, for producing a p-type sense amplifier driver enable clock $\phi_{PSE}$; a second NMOS transistor 49 having a gate connected to the output node of the bias circuit 50E, and a current maintaining circuit connected between the external power voltage ext.$V_{CC}$ and the output line, for constantly maintaining the current flowing into the first and second NMOS transistors 48 and 49. In this case, the current maintaining circuit comprises first and second PMOS transistors 50 and 51. The source of the first PMOS transistor 50 is connected to the external power voltage ext.$V_{CC}$, with the diode-connected gate and drain. The both terminals of the second PMOS transistor 51 are connected between the drain of the first PMOS transistor 50 and the output line, with the gate connected to the ground voltage.

Figure 8A:
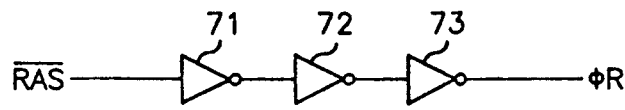
FIGS. 8A to FIG. 8C show circuit diagrams of clock signals of FIG. 7.
Figure 8B:
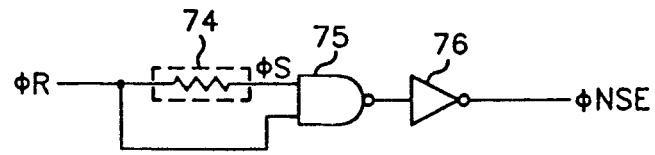
Figure 8C:
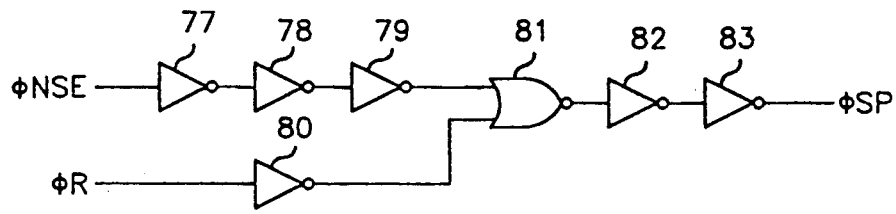

The operation of FIG. 7 will be described with reference to FIGS. 8A to 8E. As shown in FIG. 8B, a sensing enable clock $\phi_S$ produced through a delay circuit 74 and a master clock $\phi_R$ are transmitted to a NAND gate 75 and then to an inverter 76, to produce an n-type sense amplifier driver enable clock $\phi_{NSE}$. The master clock $\phi_R$ is a signal generated, through three successive inverters 71, 72 and 73 receiving a row address strobe signal $\overline{RAS}$, as shown in FIG. 8A. In FIG. 8C, the output generated through three inverters 77, 78 and 79 receiving the n-type sense amplifier driver enable clock $\phi_{NSE}$, and the output generated through an inverter 80 receiving the master clock $\phi_R$, are input into a NOR gate 81 to produce an output signal. The output signal is then delayed through two inverters 82 and 83 to produce a p-type sense amplifier enable clock $\phi_{SP}$. Turning to FIG. 7, the p-type sense amplifier enable signal SAP is initially precharged to a half level of the internal power voltage int.$V_{CC}$. That is, when the row address strobe signal $\overline{RAS}$ is in a precharged state of a logic "high" level, the p-type sense amplifier enable clock $\phi_{SP}$ is set to a logic "low" level, the second NMOS transistor 42 of the level shift circuit 50B is turned on, and the level shift circuit 50B produces an output of the logic "low" level. Therefore, the PMOS transistor 36 of the comparator enable circuit 50C is turned on, the output of the comparator 50A becomes disabled state and the logic "high" level signal is input into the trigger circuit 50D. The trigger circuit 50D is set to the logic "low" level, and the bias circuit 50E is set to the logic "high" level since the first NMOS transistor 45 is turned off. The p-type sense amplifier driver control circuit 50F produces the output of the logic "high" level, the PMOS sense amplifier driver 61 is turned off and the p-type sense amplifier enable signal SAP is precharged to the half level of the internal power voltage int.$V_{CC}$.

Figure 10:
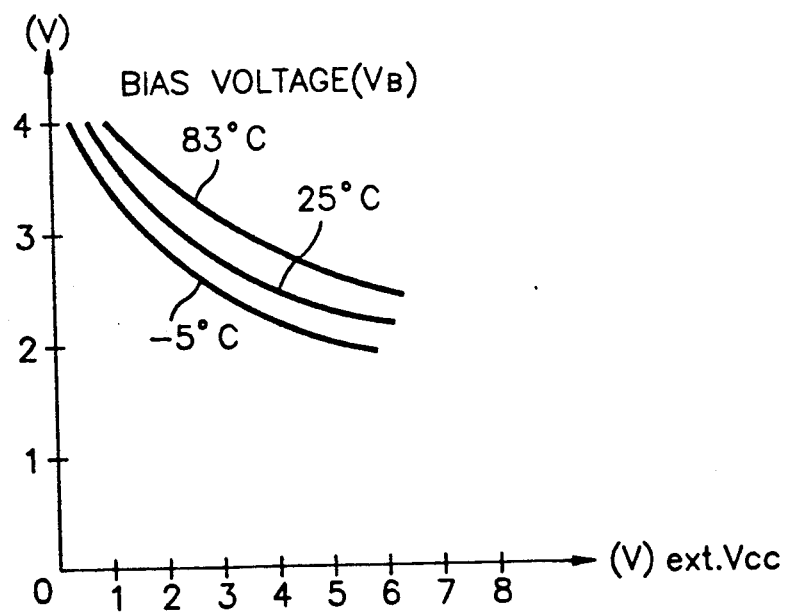
FIG. 10 shows a characteristic graph illustrating an output voltage according to the temperature of a bias circuit as a function of an external power voltage.

Now, how the bias circuit 50E is operated is described. The output line of the bias circuit 50E is connected to the driving element of the driver control circuit 50F, i.e., the gate of the second NMOS transistor 49, thus constantly setting the current $i_B$. As shown in FIG. 10, if the external voltage ext.$V_{CC}$ is increased, the voltage of the node N2 is increased. Therefore, the voltage $V_{GS}$ of the first NMOS transistor 45 is increased and the voltage $V_B$ at the node N4 is decreased. Furthermore, since the voltage $V_{GS}$ of the second NMOS transistor 49 of the driver circuit 50F is decreased, the increase of the current $i_B$ caused by the increased external power voltage ext.$V_{CC}$ can be prevented. At this time, since the voltage $V_B$ at the node N4 is continuously applied to the gate of the second NMOS transistor 49, there is no case that the NMOS transistor 49 is turned off. In contrast, if the external power voltage ext.$V_{CC}$ is decreased, since the voltage of the node N2 is decreased, the voltage $V_{GS}$ of the first NMOS transistor 45 is decreased and the voltage $V_B$ at the node N4 is increased. Moreover, since the voltage $V_{GS}$ of the second NMOS transistor 49 of the driver circuit 50F is increased, the decrease of the current $i_B$ caused by the decreased external power voltage ext.$V_{CC}$ can be prevented. Therefore, the current $i_{DS}$ between the drain and source flowing into the PMOS sense amplifier driver 61 is constantly set, with the result that a constant rising slope of the p-type sense amplifier enable signal SAP is provided, regardless of the variation of the external power voltage ext.$V_{CC}$.

Next, the operation of the driver control circuit 50F is described, If the node N2 is in the low level state, the p-type sense amplifier driver enable clock $\phi_{PSE}$ is set to the logic "high" level and the p-type sense amplifier drivers 61, 65, . . . are turned off. In contrast, the node N2 is in the logic "high" level state, the p-type sense amplifier driver enable clock $\phi_{PSE}$ is set to the logic "low" level and the p-type sense amplifier drivers 61, 65, . . . are turned on. Moreover, since the first NMOS transistor 48 is turned on, the constant current $i_B$ comes to flow. Even when the external power voltage ext.$V_{CC}$ is increased, since the current $i_B$ is constant, the voltage of the p-type sense amplifier driver enable clock $\phi_{PSE}$ is increased. In more detail, if the external power voltage ext.$V_{CC}$ is increased, the voltage between the drain and the source of the p-type sense amplifier drivers 61, 65, . . . is increased. Therefore, the gate voltage of the p-type sense amplifier drivers 61, 65, . . . i.e., the p-type sense amplifier driver enable clock $\phi_{PSE}$ is increased. As a result, the voltage $V_{GS}$ between the gate and the source is decreased, to thereby constantly maintain the current flowing into the p-type sense amplifier drivers 61, 65, . . . . Consequently, since the channel current independent of the external power voltage ext.$V_{CC}$ is provided, the rising slope of the p-type sense amplifier enable signal SAP is constant at a range of the external power voltage ext.$V_{CC}$ of the logic "high" level or "low" level, to thereby solve a problem associated with the increase of the peak current due to the rapid rising slope of the p-type sense amplifier enable signal SAP.

Next, when the row address strobe signal $\overline{RAS}$ is set to the logic "low" level and a row address is selected, the operation of FIG. 7 is described as follows. When a word line is selected and the charge sharing between a bit line and a cell is performed by the decoding of a row address. Then, a n-type sense amplifier driver enable clock $\phi_{NSE}$ is set to the logic "high" level and the NMOS sense amplifier drivers 63, 67, . . . are turned on, thereby sensing the bit lines. The p-type sense amplifier enable clock $\phi_{SP}$ is set to the logic "high" level and the output node N3 of the level shift circuit 50B reaches the external power voltage ext.$V_{CC}$. As a result, the PMOS transistor 36 of the comparator enable circuit 50C is turned off and the output of the comparator 50A is enabled. Since the reference voltage $V_{REF}$ of 4 V is larger than the voltage of the p-type sense amplifier enable signal SAP, the comparator 50A is set to the logic "low" level at the node N1. In this case, the p-type sense amplifier enable clock $\phi_{SP}$ is applied to the gate of the third NMOS transistor 35 in the comparator 50A. The trigger-circuit 50D detects the logic "low" level state of the node N1 and generates the logic "high" level at the node N2. The output of the trigger circuit 50D of the logic "high" level state enables the bias circuit 50E and the driver control circuit 50F.

Figure 1:
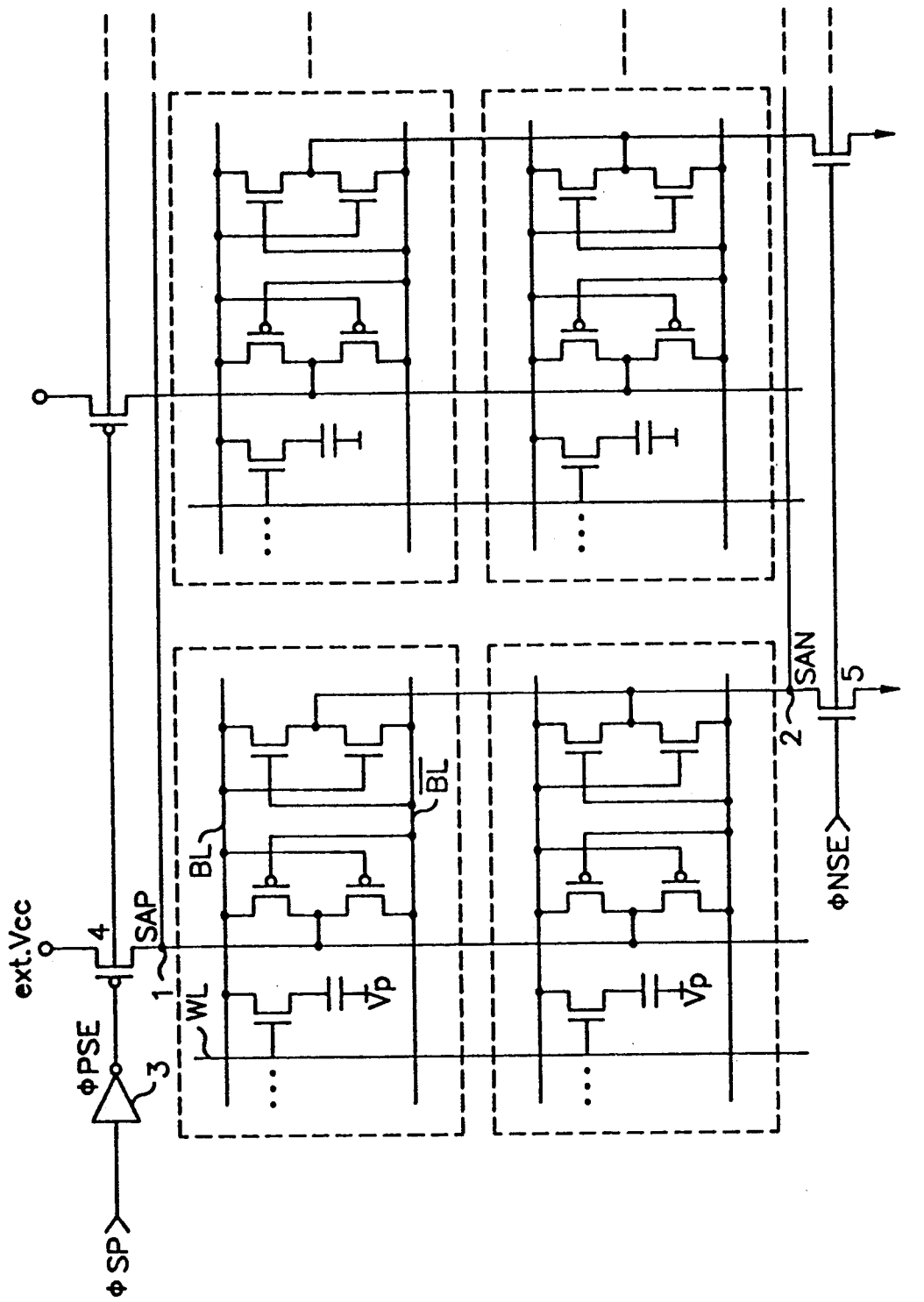
FIG. 1 shows a circuit diagram illustrating a conventional sense amplifier control circuit.
Figure 2:
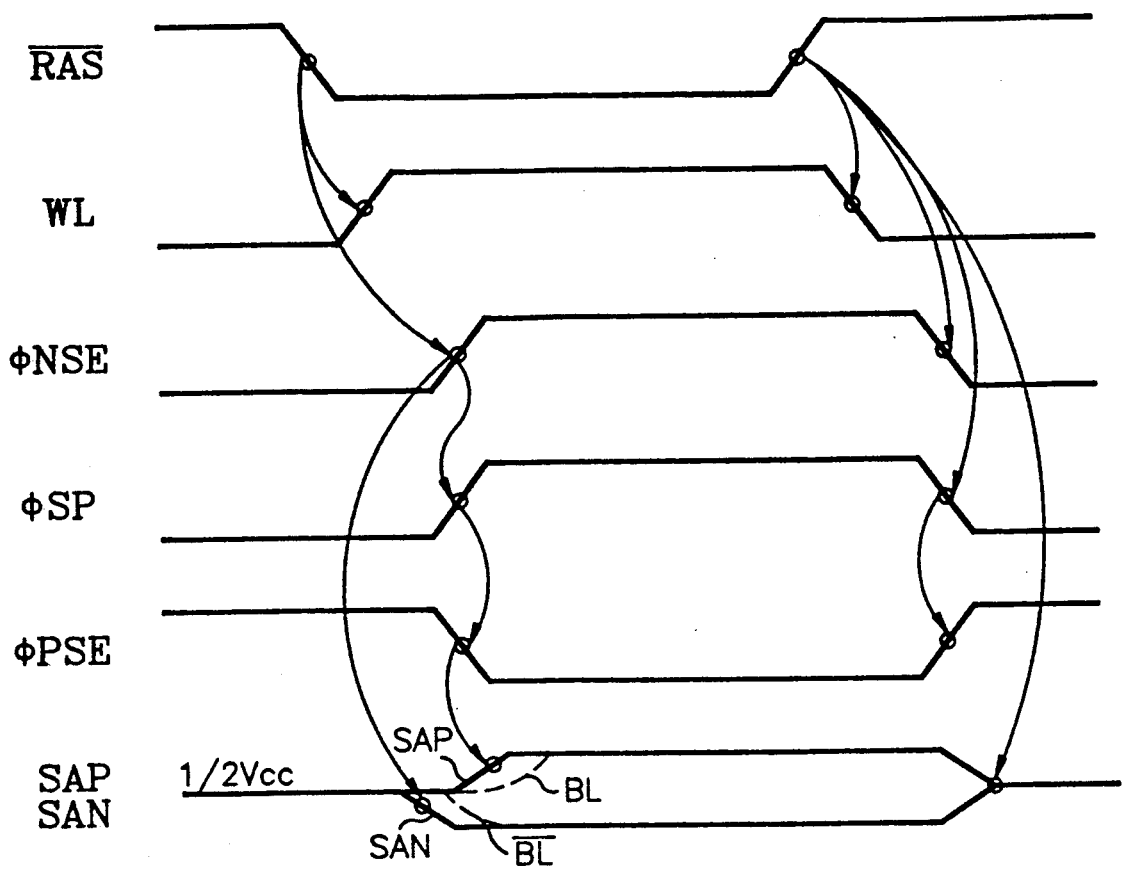
FIG. 2 shows a timing chart illustrating an operation of the circuitry shown in FIG. 1.
Figure 3:
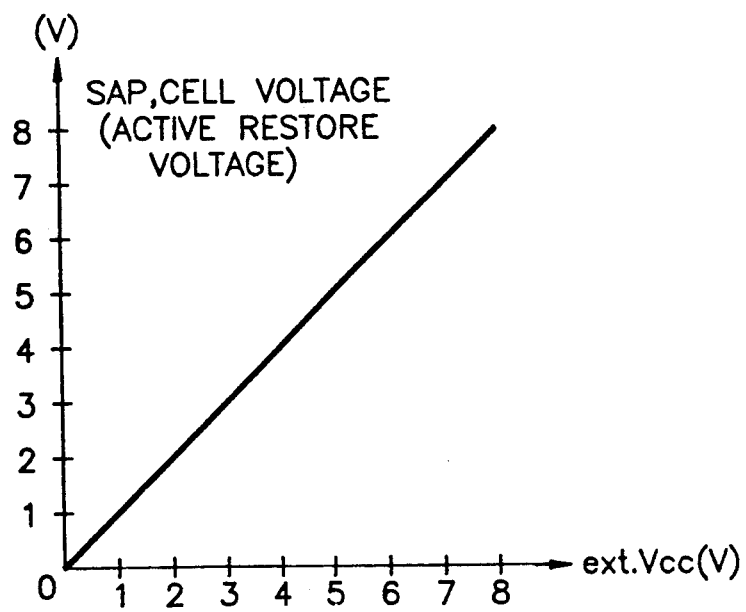
FIG. 3 shows a characteristic graph illustrating the voltage applied to a cell in FIG. 1.
Figure 4:
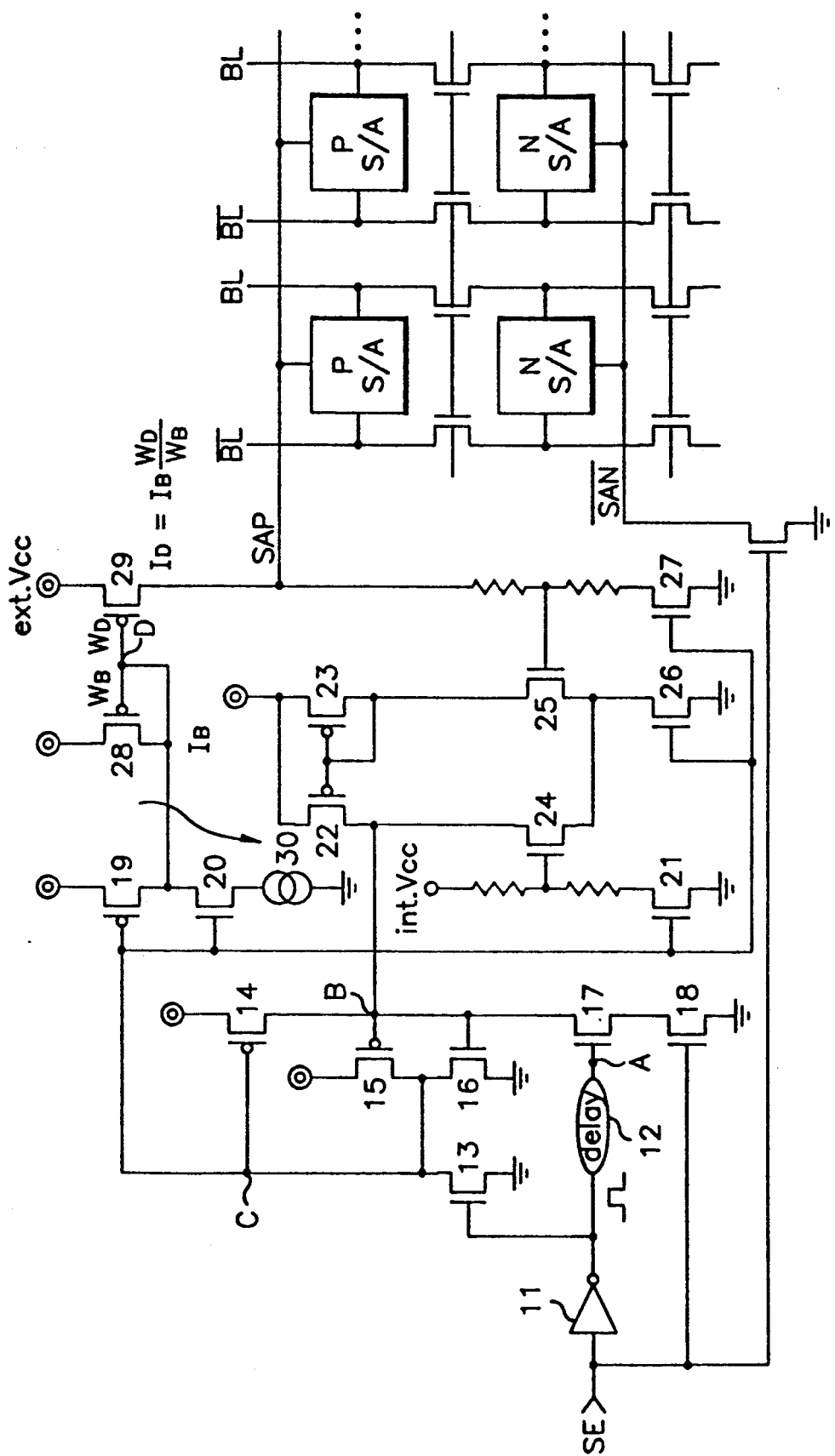
FIG. 4 shows a circuit diagram illustrating another sense amplifier control circuit of a prior art.
Figure 5:
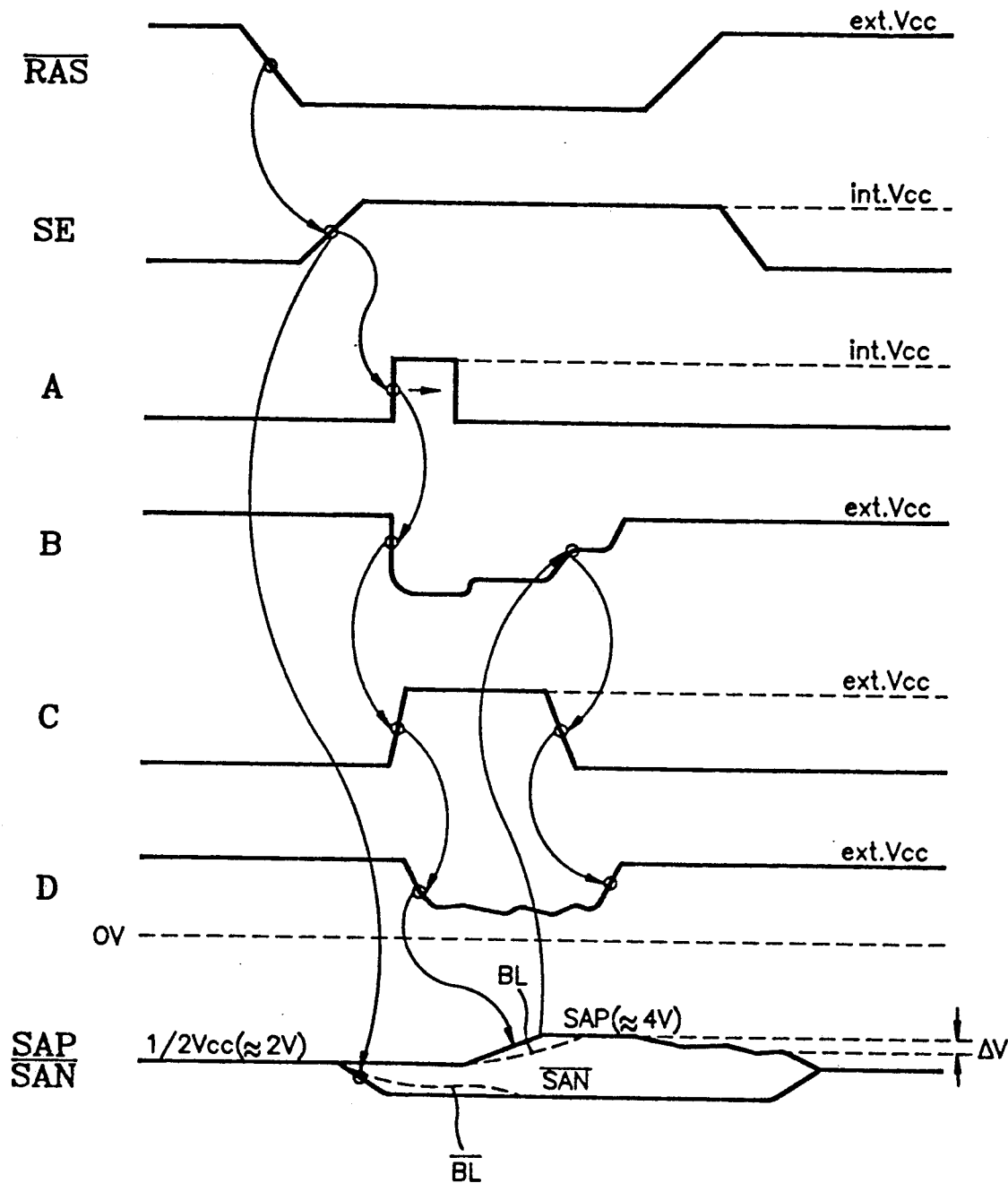
FIG. 5 shows a timing chart illustrating an operation of the circuitry shown in FIG. 4.
Figure 8E:
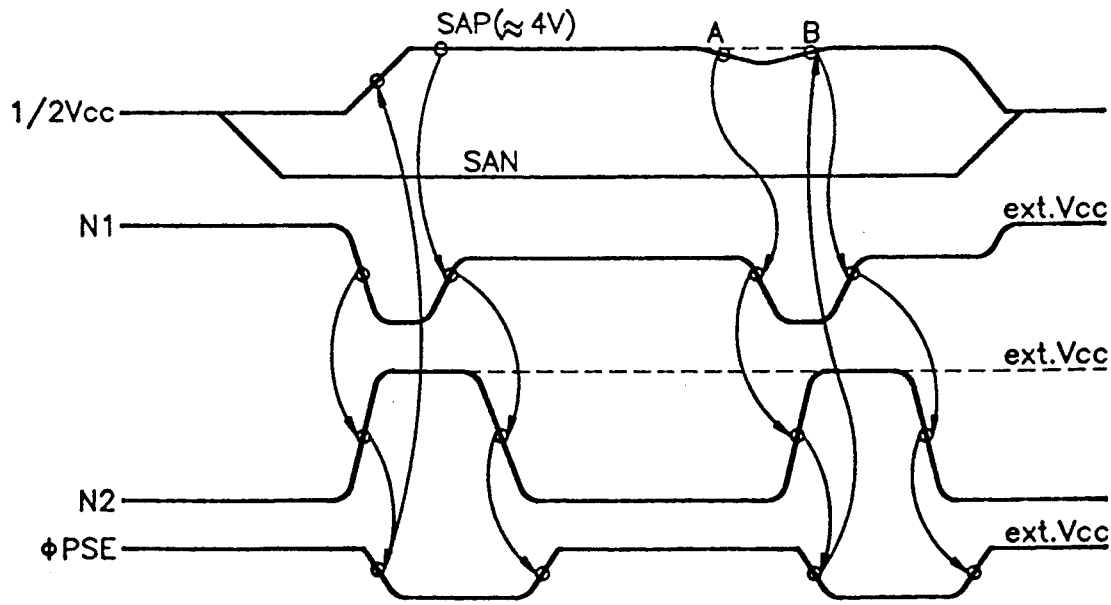
FIG. 8E shows a partial more detailed timing chart of FIG. 8D
Figure 8D:
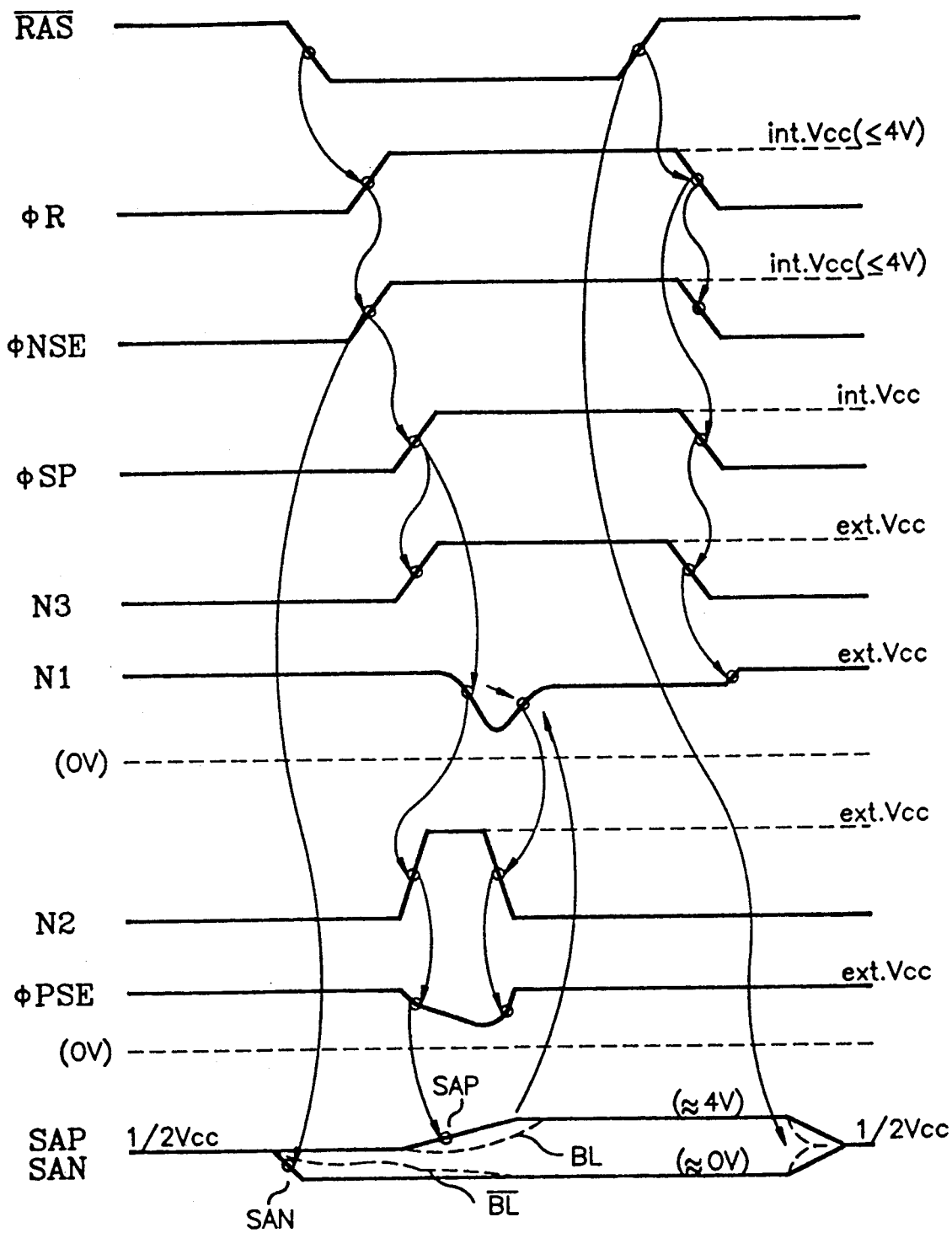
FIG. 8D shows a timing chart illustrating an operation of the circuitry shown in FIG. 7.
Figure 9:
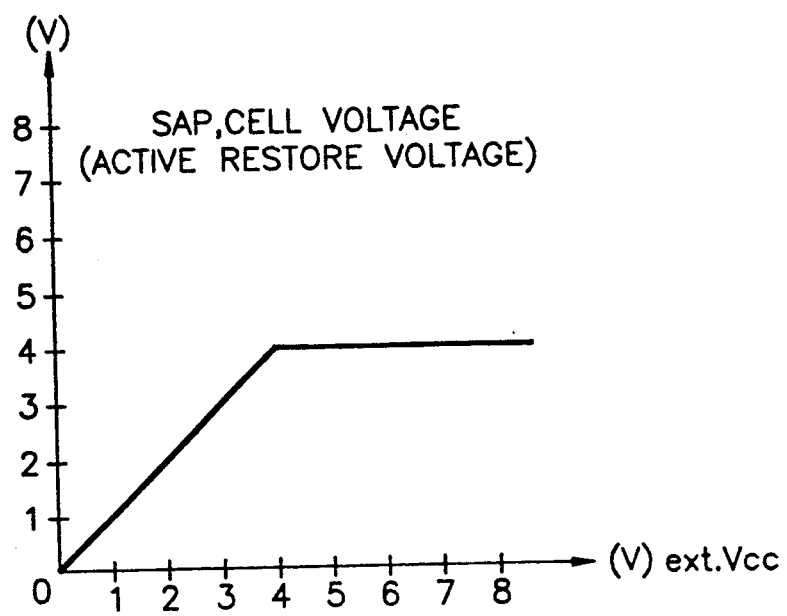
FIG. 9 shows a characteristic graph illustrating the voltage applied to a cell in FIG. 7.

Consequently, the p-type sense amplifier drivers 61, 65, ... are turned on by the p-type sense amplifier driver enable clock $\Phi_{PSE}$, the voltage of the p-type sense amplifier enable signal SAP has a constant rising slope independent of the variation of the external power voltage ext.$V_{CC}$. Moreover, if the voltage of the p-type sense amplifier enable signal SAP reaches 4 V, the gate voltage of the first NMOS transistor 33 of the comparator 50A is increased. Therefore, the node N1 is set to the logic "high" level, the output of the trigger circuit 50D is set to the logic "low" level, and the output of the bias circuit 50E is set to the internal power voltage int.$V_{CC}$. Since the first NMOS transistor 48 of the driver control circuit 50F is turned off, the p-type sense amplifier driver enable clock $\phi_{PSE}$ is set to the logic "high" level and the p-type sense amplifier drivers 61, 65, ... are turned off, which prevents the voltage of the p-type sense amplifier enable signal SAP from increasing above 4 V as shown in FIG. 9. If the voltage of the p-type sense amplifier enable signal SAP is lowered to the voltage of below 4 V at a range of A due to the leakage current of each transistor constituting the memory cell and the sense amplifier the voltage of the p-type sense amplifier enable signal SAP is again raised to a range of B in dependence upon the operation of the comparator 50A as shown in FIG. 8E. In a conventional sense amplifier control circuit shown in FIG. 4, the comparator 50A is not operable after the voltage of the p-type sense amplifier enable signal SAP rises from the precharged state to a voltage of 4 V. However, in the sense amplifier control circuit in accordance with the present invention, since the control voltage of the comparator 50A becomes the p-type sense amplifier enable clock $\phi_{SP}$ and is a continuously enabled state, the voltage of the SAP is maintained as a voltage of 4 V, by detecting the voltage of the p-type sense amplifier enable signal SAP whenever the SAP is lowered.

As described above, in the sense amplifier control circuit according to the present invention, since the voltage applied to the memory cell is clamped at a given level (in this case, 4 V), the distortion of the device characteristic of the cells caused by the logic "high" level of $V_{CC}$ can be prevented. Moreover, the peak current due to the p-type sense amplifier sensing is suppressed and the power noise is reduced, thereby improving the reliability of a semiconductor memory device.

While the invention has been particularly shown and described with reference to the preferred embodiment of the present invention thereof, it will be understood by those skilled in the art that the foregoing and other changes in form and details may be made without departing from the spirit and scope of the present invention.

What is claimed is:

1. A sense amplifier control circuit of a semiconductor memory device, said semiconductor memory device having a sense amplifier and a first sense amplifier driver, which are operated by a given control signal, comprising:
   a driver control circuit connected to transfer an output thereof to a control terminal of said first sense amplifier driver, for constantly maintaining a current flowing into said first sense amplifier driver;
   a bias circuit connected to transfer an output thereof to a control terminal of a driving element of said driver control circuit, for constantly maintaining a current flowing into said driving element, regardless of an increase and decrease of an external power voltage; and
   means connected to receive a voltage applied to said sense amplifier and to transfer an output thereof to said driver control circuit and said bias circuit, for driving said driver control circuit and bias circuit.

2. A sense amplifier control circuit as claimed in claim 1, wherein said first sense amplifier driver is comprised of a PMOS transistor.

3. A sense amplifier control circuit as claimed in claim 1, wherein said driver control circuit comprises:
   a first PMOS transistor having a source connected to a first power voltage and having a gate connected to a first input line;
   a first NMOS transistor connected, by a gate thereof, to said first input line;
   an output line commonly connected to a common terminal of said first PMOS and first NMOS transistors and connected to said control terminal of said first sense amplifier driver;
   a second NMOS transistor having a channel connected between said first NMOS transistor and a ground voltage, and having a gate connected to a second input line; and
   means connected between said first power voltage and said output line, for constantly maintaining a current flowing into said first and second NMOS transistors.

4. A sense amplifier control circuit as claimed in claim 3, wherein said current maintaining means comprises:
   a second PMOS transistor having a source connected to said first power voltage and having diode-connected gate and drain; and
   a third PMOS transistor having a channel connected between said drain of said second PMOS transistor and said output line, and having a gate connected to said ground voltage.

5. A sense amplifier control circuit as claimed in claim 3 or 4, wherein said first power voltage is of an external power voltage having a given first level.

6. A sense amplifier control circuit as claimed in claim 4, wherein said bias circuit comprises:
   a fourth PMOS transistor having a source connected to a second power voltage and having a gate connected to said ground voltage;
   a third NMOS transistor having a drain connected to a drain of said fourth PMOS transistor and a gate connected to said first input line;
   a first output node commonly connected to a common terminal of said fourth PMOS and third NMOS transistors; and
   a fourth NMOS transistor having a drain and gate diode-connected to said source of said third NMOS transistor and having a source connected to said ground voltage.

7. A sense amplifier control circuit as claimed in claim 6, wherein said second power voltage is of an internal power voltage having a given second level.

8. A sense amplifier control circuit as claimed in claim 6, wherein said driving means comprises:
- a third input line connected to a sense amplifier enable node, said sense amplifier enable node being connected to one terminal of a channel of said first sense amplifier driver;
- a fourth input line for applying a given reference voltage;
- a fifth input line for applying a given clock signal;
- a comparator having a second output node; and
- a trigger circuit having an input node connected to said second output node of said comparator and having a third output node commonly connected to said first input line of said bias circuit and said driver control circuit.

9. A sense amplifier control circuit as claimed in claim 8, wherein said reference voltage is a level of said second power voltage.

10. A sense amplifier control circuit as claimed in claim 8, wherein said clock signal is generated after a second sense amplifier driver is driven.

11. A sense amplifier control circuit as claimed in claim 10, wherein said second sense amplifier driver is a NMOS sense amplifier driver.

12. A sense amplifier control circuit as claimed in claim 8, wherein said comparator comprises:
- a fifth PMOS transistor having a source connected to said first power voltage and having diode-connected gate and drain;
- a sixth PMOS transistor having a source connected to said first power voltage and having a gate connected to said gate of said fifth PMOS transistor;
- a fifth NMOS transistor having a gate connected to said third input line and having a drain connected to said drain of said fifth PMOS transistor;
- a sixth NMOS transistor having a gate connected to said fourth input line and having a drain connected to a drain of said fifth PMOS transistor;
- said second output node connected to a common terminal of said sixth PMOS and sixth NMOS transistors; and
- a seventh NMOS transistor having a drain commonly connected to each source of said fifth and sixth NMOS transistors, a gate connected to said fifth input line and a source connected to said ground voltage.

13. A sense amplifier control circuit as claimed in claim 8, wherein said trigger circuit comprises:
- a seventh PMOS transistor having a source connect to said first power voltage and a gate connected to said input node;
- a eighth NMOS transistor having a source connected to said ground voltage and a gate connected to said input node; and
- said third output node commonly connected to each drain of said seventh PMOS and eighth NMOS transistors.

14. A sense amplifier control circuit capable of improving a device characteristic of a cell, by adjusting a voltage of a first power source into a given level, and by applying the voltage of said given level to said cell, comprising:
- a comparator for comparing said voltage applied to said cell with a reference voltage and producing an output in dependence upon a clock signal;
- a level shift circuit for shifting a voltage potential of said clock signal;
- means controlled by an output of said level shift circuit, for enabling and disabling said output of said comparator;
- a trigger circuit for inverting said output of said comparator;
- a driver control circuit coupled to receive an output of said trigger circuit, for maintaining a current flowing into a first sense amplifier driver at said a given level, said driver control circuit having an output terminal being connected to a control terminal of said first sense amplifier driver; and
- a bias circuit for maintaining said current flowing into driving elements of said driver control circuit.

15. A sense amplifier control circuit as claimed in claim 14, wherein said first and second power voltage is 5 V and 4 V, respectively and said reference voltage is 4 V.

16. A sense amplifier control circuit as claimed in claim 14, wherein said clock signal is generated after a second sense amplifier driver is driven in response to a row address selected by a user.

17. A sense amplifier control circuit as claimed in claim 16, wherein said second sense amplifier driver is a NMOS sense amplifier driver.

18. A sense amplifier control circuit as claimed in claim 14, wherein said level shift circuit comprises:
- a first PMOS transistor having a source connected to said first power voltage;
- a second PMOS transistor having a source connected to said first power voltage;
- a first NMOS transistor having a gate connected to said clock signal, a source connected to ground voltage and a drain commonly connected to a drain of said first PMOS transistor and a gate of said second PMOS transistor;
- an inverter having an input terminal connected to said clock signal and a control input terminal connected to said second power voltage;
- a second NMOS transistor having a source connected to said ground voltage and a gate connected to an output terminal of said inverter; and
- an output node commonly connected to a gate of said first PMOS transistor and each drain of said second PMOS and said second NMOS transistors.

19. A sense amplifier control circuit as claimed in claim 14, wherein said enabling/disabling means is comprised of a PMOS transistor having a source connected to said first power voltage, a gate connected to said output node of said level shift circuit, and a drain connected to an output node of said comparator.

20. A sense amplifier control circuit for maintaining a voltage applied to a memory cell of a semiconductor memory device having a sense amplifier and a sense amplifier driver independently from variation of an external power voltage, said sense amplifier control circuit comprising:
- means for comparing the voltage applied to said memory cell with a reference voltage in dependence upon a sensing enable signal to provide a first resultant voltage;
- shifting means coupled to receive said sensing enable signal, for shifting voltage potential of said sensing enable signal from a first potential into a second potential to produce a shifted enable signal;

means for enabling transmission of said first resultant voltage in dependence upon said shifted enable signal to provide a second resultant voltage;

driver control means for driving current into said sense amplifier driver to maintain the voltage applied to said memory cell substantially at a defined voltage level irrespective of variation of said external power voltage; and biasing means responsive to said second resultant voltage signal, for generating a bias voltage for enabling said driver control means to maintain said voltage applied to said memory cell substantially at said defined voltage level.

21. The sense amplifier control circuit as claimed in claim 20, wherein said comparing means comprises:

a first transistor having a first electrode of a principal electrically conducting channel coupled to said external power voltage, a second electrode of said principal electrically conducting channel and a control electrode respectively coupled to a first node;

a second transistor having a first electrode of a principal electrically conducting channel coupled to said external power voltage, a second electrode of said principal electrically conducting channel coupled to an output terminal for providing said first resultant voltage, and a control electrode coupled to said first node;

a third transistor having a first electrode of a principal electrically conducting channel coupled to said first node, a second electrode of said principal electrically conducting channel coupled to a second node and a control electrode coupled to receive the voltage applied to said memory cell;

a fourth transistor having a first electrode of a principal electrically conducting channel coupled to said second node, a second electrode of said principal electrically conducting channel connected to ground and a control electrode coupled to receive said sensing enable signal; and a fifth transistor having a first electrode of a principal electrically conducting channel coupled to said output terminal, a second electrode of said principal electrically conducting channel coupled to said second node and a control electrode coupled to receive said reference voltage.

22. The sense amplifier control circuit as claimed in claim 20, wherein said shifting means comprises:

a first transistor having a first electrode of a principal electrically conducting channel coupled to said external power voltage and a second electrode of said principal electrically conducting channel coupled to a first node;

a second transistor having a first electrode of a principal electrically conducting channel coupled to said first node and a second electrode of said principal electrically conducting channel coupled to ground;

a third transistor having a first electrode of a principal electrically conducting channel coupled to said external power voltage and a second electrode of said principal electrically conducting channel coupled to an output terminal for providing said shifted enable signal;

a fourth transistor having a first electrode of a principal electrically conducting channel coupled to said output terminal and a second electrode of said principal electrically conducting channel connected to ground;

a control electrode of said first transistor being coupled to said output terminal;

a control electrode of said third transistor being coupled to said first node;

a control electrode of said second transistor being coupled to receive said sensing enable signal; and an inverter being coupled to an internal power voltage and interposed between control electrodes of said second and fourth transistors.

23. The sense amplifier control circuit as claimed in claim 20, wherein said biasing means comprises:

a first transistor having a first electrode of a principal electrically conducting channel coupled to an internal power voltage, a second electrode of said principal electrically conducting channel coupled to an output terminal for generating said bias voltage and a control electrode coupled to ground;

a second transistor having a first electrode of a principal electrically conducting channel coupled to said output terminal, a second electrode of said principal electrically conducting channel coupled to a first node and a control electrode coupled to receive said second resultant voltage; and a third transistor having a first electrode of a principal electrically conducting channel coupled to said first node, a second electrode of said principal electrically conducting channel coupled to ground and a control electrode coupled to said first node.

24. The sense amplifier control circuit as claimed in claim 20, wherein said driver control means comprises:

a first transistor having a first electrode of a principal electrically conducting channel coupled to said external power voltage, a second electrode of said principal electrically conducting channel coupled to an output terminal and a control electrode coupled to receive said second resultant voltage;

a second transistor having a first electrode of a principal electrically conducting channel coupled to said output terminal, a second electrode of said principal electrically conducting channel coupled to a first node and a control electrode coupled to receive said second resultant voltage;

a third transistor having a first electrode of a principal electrically conducting channel coupled to said first node, a second electrode of said principal electrically conducting channel coupled to ground and a control electrode coupled to receive said bias voltage;

a fourth transistor having a first electrode of a principal electrically conducting channel coupled to said external power voltage, a second electrode of said principal electrically conducting channel and a control electrode coupled to a second node; and a fifth transistor having a first electrode of a principal electrically conducting channel coupled to said second node, a second electrode of said principal electrically conducting channel coupled to said output terminal and a control electrode coupled to ground.

25. The sense amplifier control circuit as claimed in claim 20, wherein said enabling means comprises:

a first transistor having a first electrode of a principal electrically conducting channel coupled to said external power voltage, a second electrode of said principal electrically conducting channel coupled to receive said first resultant voltage and a control electrode coupled to receive said shifted enable signal;

a second transistor having a first electrode of a principal electrically conducting channel coupled to said external power voltage and a second electrode of said principal electrically conducting channel coupled to an output terminal for providing said second resultant voltage;

a third transistor having a first electrode of a principal electrically conducting channel coupled to said output terminal and a second electrode of said principal electrically conducting channel coupled to ground; and control electrodes of said second and third transistors being coupled to receive said first resultant voltage.

26. The sense amplifier control circuit as claimed in claim 20, wherein said external power voltage is 5 volts, said reference voltage is 4 volts, and the first potential of said sensing enable signal is said reference voltage of 4 volts and the second potential of said sensing enable signal is said external power voltage of 5 volts.

27. The sense amplifier control circuit as claimed in claim 26, wherein said defined voltage level of the voltage applied to said memory cell is 4 volts.

28. A sense amplifier control circuit, comprising:
an array of memory cells;
a plurality of pairs of bit lines, each bit line pair of said pairs of bit lines being coupled to said memory cells;
sense amplifier driver means for driving a voltage applied to said memory cells via said bit line pair;
means for providing a sense amplifier enable signal representative of potential of the voltage applied to said memory cells from said bit line pair;
means for determining the voltage applied to said memory cells by comparing a voltage potential of said sense amplifier enable signal with a reference voltage in dependence upon a sensing clock signal to provide a first resultant voltage;
means for shifting voltage potential of said sensing clock signal from a first voltage potential into a second voltage potential to produce a shifted clock signal;
means for enabling transmission of said first resultant voltage in dependence upon said shifted clock signal to provide a second resultant voltage;
driver control means for driving current into said sense amplifier driver means to maintain the voltage applied to said memory cells substantially at a defined voltage level; and
biasing means responsive to said second resultant voltage signal, for generating a bias voltage for enabling said driver control means to maintain said voltage applied to said memory cells substantially at said defined voltage level.

29. The sense amplifier control circuit as claimed in claim 28, wherein said comparing means comprises:
a first transistor having a first electrode of a principal electrically conducting channel coupled to an external power supply, a second electrode of said principal electrically conducting channel and a control electrode respectively coupled to a first node;
a second transistor having a first electrode of a principal electrically conducting channel coupled to an external power supply, a second electrode of said principal electrically conducting channel coupled to an output terminal and a control electrode coupled to said first node;
a third transistor having a first electrode of a principal electrically conducting channel coupled to said first node, a second electrode of said principal electrically conducting channel coupled to a second node and a control electrode coupled to receive said sense amplifier enable signal;
a fourth transistor having a first electrode of a principal electrically conducting channel coupled to said second node, a second electrode of said principal electrically conducting channel connected to ground and a control electrode coupled to receive said sensing clock signal; and
a fifth transistor having a first electrode of a principal electrically conducting channel coupled to said output terminal, a second electrode of said principal electrically conducting channel coupled to said second node and a control electrode coupled to receive said reference voltage, and said shifting means comprises:
a sixth transistor having a first electrode of a principal electrically conducting channel coupled to said external power supply and a second electrode of said principal electrically conducting channel coupled to a third node;
a seventh transistor having a first electrode of a principal electrically conducting channel coupled to said third node and a second electrode of said principal electrically conducting channel coupled to ground;
a eighth transistor having a first electrode of a principal electrically conducting channel coupled to said external power supply and a second electrode of said principal electrically conducting channel coupled to an output terminal;
a ninth transistor having a first electrode of a principal electrically conducting channel coupled to said output terminal and a second electrode of said principal electrically conducting channel connected to ground;
a control electrode of said sixth transistor being coupled to said output terminal;
a control electrode of said eighth transistor being coupled to said first node;
a control electrode of said seventh transistor being coupled to receive said sensing clock signal; and
an inverter being coupled to an internal voltage supply and interposed between control electrodes of said seventh and ninth transistors.

30. The sense amplifier control circuit as claimed in claim 28, wherein said biasing means comprises:
a first transistor having a first electrode of a principal electrically conducting channel coupled to an internal power voltage, a second electrode of said principal electrically conducting channel coupled to an output terminal for generating said bias voltage and a control electrode coupled to ground;
a second transistor having a first electrode of a principal electrically conducting channel coupled to said output terminal, a second electrode of said principal electrically conducting channel coupled to a first node and a control electrode coupled to receive said second resultant voltage; and
a third transistor having a first electrode of a principal electrically conducting channel and a control electrode coupled to said first node, and a second electrode of said principal electrically conducting channel connected to ground. conducting channel coupled to an output terminal for generating said bias voltage and a control electrode coupled to ground;

a second transistor having a first electrode of a principal electrically conducting channel coupled to said output terminal, a second electrode of said principal electrically conducting channel coupled to a first node and a control electrode coupled to receive said second resultant voltage; and a third transistor having a first electrode of a principal electrically conducting channel and a control electrode coupled to said first node, and a second electrode of said principal electrically conducting channel connected to ground.

31. The sense amplifier control circuit as claimed in claim 28, wherein said driver control means comprises:

a first transistor having a first electrode of a principal electrically conducting channel coupled to an external power voltage, a second electrode of said principal electrically conducting channel coupled to an output terminal for providing an output signal to maintain the voltage applied to said memory cells, and a control electrode coupled to receive said second resultant voltage;

a second transistor having a first electrode of a principal electrically conducting channel coupled to said output terminal, a second electrode of said principal electrically conducting channel coupled to a first node and a control electrode coupled to receive said second resultant voltage;

a third transistor having a first electrode of a principal electrically conducting channel coupled to said first node, a second electrode of said principal electrically conducting channel coupled to ground and a control electrode coupled to receive said bias voltage;

a fourth transistor having a first electrode of a principal electrically conducting channel coupled to said external power voltage, a second electrode of said principal electrically conducting channel and a control electrode coupled to a second node; and a fifth transistor having a first electrode of a principal electrically conducting channel coupled to said second node, a second electrode of said principal electrically conducting channel coupled to said output terminal and a control electrode coupled to ground.

32. The sense amplifier control circuit as claimed in claim 28, wherein said enabling means comprises:

a first transistor having a first electrode of a principal electrically conducting channel coupled to an external power voltage, a second electrode of said principal electrically conducting channel coupled to receive said first resultant voltage and a control electrode coupled to receive said shifted clock signal;

a second transistor having a first electrode of a principal electrically conducting channel coupled to said external power voltage and a second electrode of said principal electrically conducting channel coupled to an output terminal for providing said second resultant voltage;

a third transistor having a first electrode of a principal electrically conducting channel coupled to said output terminal and a second electrode of said principal electrically conducting channel coupled to ground; and control electrodes of said second and third transistors being coupled to receive said first resultant voltage.

* * * * *

UNITED STATES PATENT AND TRADEMARK OFFICE
CERTIFICATE OF CORRECTION

PATENT NO. : 5,267,203

DATED : 30 November 1993

INVENTOR(S) : Hong-Seon HWANG, et al.

It is certified that error appears in the above-identified patent and that said Letters Patent is hereby corrected as shown below:

| | | | |
|---|---|---|---|
| Claim 13, | Column 9, | Line 55, | change "connect" to --connected--; |
| Claim 29, | Column 13, | Line 66, | change "an" to --said--; |
| Claim 29, | Column 14, | Line 6, | insert --channel-- after "conducting"; |
| Claim 30, | delete "Column 14, Line 59 through Column 15, Line 4". | | |

Signed and Sealed this

Seventeenth Day of May, 1994

Attest:

BRUCE LEHMAN

Attesting Officer     Commissioner of Patents and Trademarks